United States Patent
Mansri et al.

(10) Patent No.: US 11,874,340 B2
(45) Date of Patent: Jan. 16, 2024

(54) OPEN-CIRCUIT DETECTOR

(71) Applicant: NXP USA, Inc., Austin, TX (US)

(72) Inventors: Mohammed Mansri, Chandler, AZ (US); Mahraj Sivaraj, Cedar Park, TX (US); Hamada Ahmed, Chandler, AZ (US); Tarek Hakam, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/804,844

(22) Filed: May 31, 2022

(65) Prior Publication Data

US 2023/0384396 A1    Nov. 30, 2023

(51) Int. Cl.
     *G01R 31/54*      (2020.01)
     *G05F 1/625*      (2006.01)

(52) U.S. Cl.
     CPC .............. *G01R 31/54* (2020.01); *G05F 1/625* (2013.01)

(58) Field of Classification Search
     CPC ................................. G01R 31/54; G05F 1/625
     See application file for complete search history.

(56) References Cited

U.S. PATENT DOCUMENTS

| | | | |
|---|---|---|---|
| 6,295,621 B1 | 9/2001 | Erhart et al. | |
| 7,280,333 B2 | 10/2007 | Horsky et al. | |
| 8,237,424 B2 | 8/2012 | Marty-Blavier et al. | |
| 8,416,546 B2 | 4/2013 | Arndt et al. | |
| 10,203,710 B2 | 2/2019 | Bhattad et al. | |
| 10,496,114 B2 | 12/2019 | Mouret et al. | |
| 11,611,303 B2* | 3/2023 | Tseng | H02P 21/22 |
| 2017/0299644 A1* | 10/2017 | Kaltenegger | H03K 17/687 |
| 2019/0361068 A1 | 11/2019 | Liao et al. | |
| 2021/0190858 A1 | 6/2021 | Sato | |

FOREIGN PATENT DOCUMENTS

DE    102017201210 A1    7/2018
WO    WO-2021165447 A1    8/2021

* cited by examiner

*Primary Examiner* — Christopher E Mahoney

(57) ABSTRACT

One example discloses an open-circuit detector, comprising: a first current source configured to inject a current at an output of a closed-loop circuit; a detector configured to monitor a voltage of the closed-loop circuit; wherein the detector is configured to indicate whether the voltage monitored exceeds a predetermined threshold voltage; a controller configured to regulate the current injected by the first current source; wherein the controller is configured to set an open-circuit flag if the current injected caused the voltage to exceed the predetermined threshold voltage.

20 Claims, 11 Drawing Sheets

OPEN-CIRCUIT DETECTOR

The present specification relates to systems, methods, apparatuses, devices, articles of manufacture and instructions for open-circuit detection.

SUMMARY

According to an example embodiment, an open-circuit detector, comprising: a first current source configured to inject a current at an output of a closed-loop circuit; a detector configured to monitor a voltage of the closed-loop circuit; wherein the detector is configured to indicate whether the voltage monitored exceeds a predetermined threshold voltage; a controller configured to regulate the current injected by the first current source; wherein the controller is configured to set an open-circuit flag if the current injected caused the voltage to exceed the predetermined threshold voltage.

In another example embodiment, the controller is configured to set the open-circuit flag if the voltage exceeded the predetermined threshold voltage within a predetermined time after the current was injected.

In another example embodiment, the voltage monitored by the detector is at a regulated output of the closed-loop circuit.

In another example embodiment, the voltage monitored by the detector is at a node internal to the closed-loop circuit.

In another example embodiment, the controller is configured to cause the first current source to inject the current while the closed-loop circuit is operating.

In another example embodiment, the controller is configured to cause the first current source to inject the current at multiple intervals after the closed-loop circuit starts operating and before the closed-loop circuit stops operating.

In another example embodiment, the controller is configured to adjust an amplitude or duration of the current injected by the first current source based on a load current drawn at the output of the closed-loop circuit.

In another example embodiment, further comprising a current drain coupled between the output and a ground; wherein the controller is configured to adjust an amount of a current drained by the current drain based on a discharge time of an external load capacitor coupled to the output.

In another example embodiment, the output of the closed-loop circuit is configured to be coupled an external capacitor configured to keep the output voltage within a predetermined ripple voltage range; and the current injected by the current source does not cause the output voltage to exceed the predetermined ripple voltage range.

In another example embodiment, the closed-loop circuit is a voltage regulator including an output driver and a compensation capacitor; the compensation capacitor is coupled to a gate of the output driver; further comprising a second current source coupled in parallel with the first current source; wherein the controller is configured to adjust a duration or amplitude of the current injected by the second current source based on a value of the compensation capacitor.

In another example embodiment, the closed-loop circuit is a voltage regulator.

In another example embodiment, the voltage regulator is a low drop out (LDO) regulator.

In another example embodiment, the current is a pull up current injected at an output lead of the voltage regulator.

In another example embodiment, the open-circuit detector is embedded within an integrated circuit.

In another example embodiment, the detector is coupled to monitor the voltage at an output pin of a chip package.

In another example embodiment, the detector is coupled to monitor the voltage at a wire bond between an integrated circuit die and a lead-frame within a chip package.

In another example embodiment, the voltage monitored by the detector is at an output of an operational amplifier internal to the closed-loop circuit.

According to an example embodiment, an open-circuit detector, comprising: a current source configured to inject a current at an output of an open-loop circuit; a detector configured to monitor a voltage of the open-loop circuit; wherein the detector is configured to indicate whether the voltage exceeds a predetermined threshold voltage; a controller configured to regulate the current injected by the current source; wherein the controller is configured to set an open-circuit flag if the current injected caused the voltage to exceed the predetermined threshold voltage.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1A:
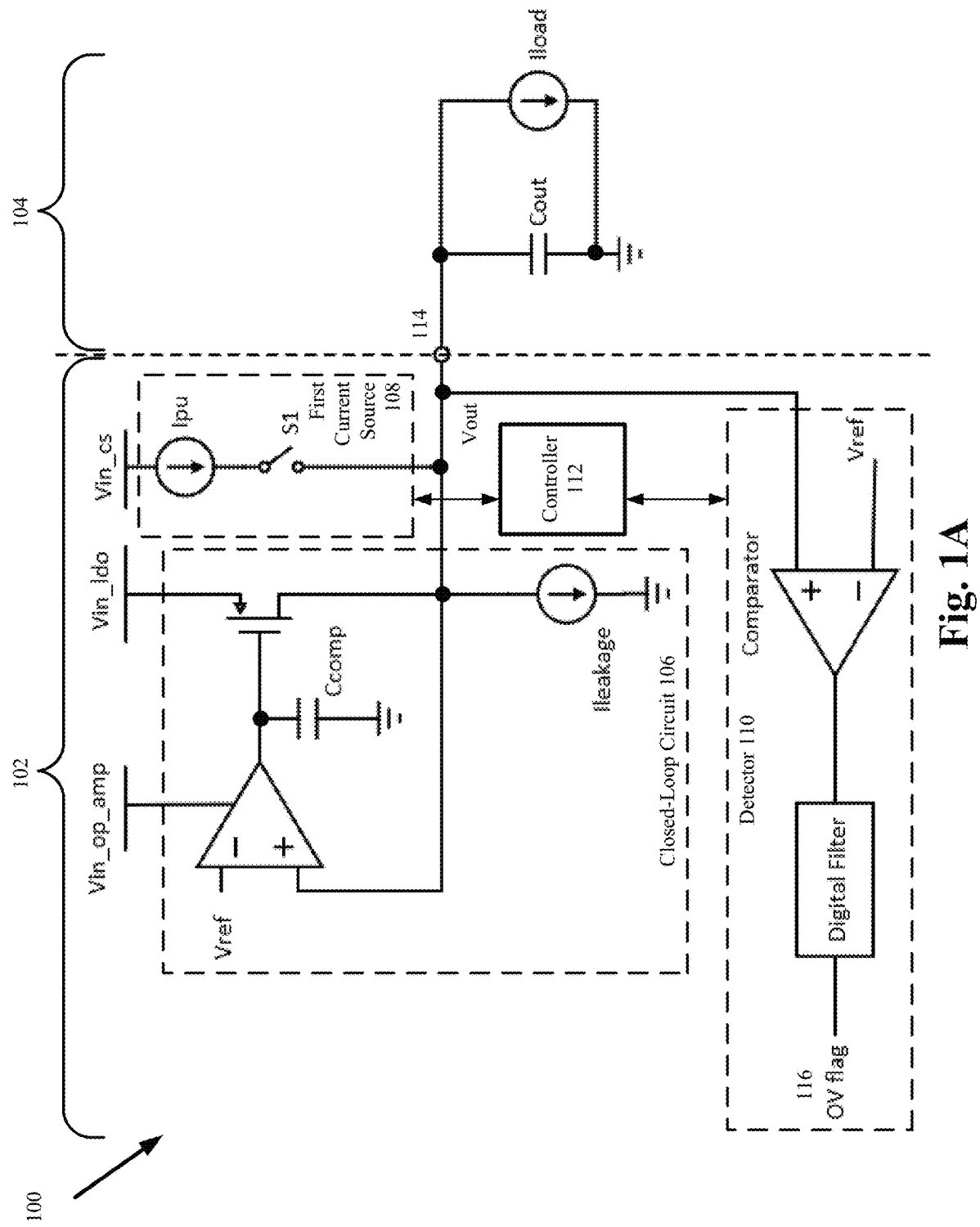
FIG. 1A represents a first example of an open-circuit detector.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Open-circuit detection within integrated circuit dies, chip packages, and between a chip package and a circuit board is often necessary for a safe shut-down of a circuit or to place a larger system into a safe-mode.

Discussed herein are various example embodiments of an open-circuit detector configured to detect various pin-lift conditions in a monitored circuit. Such circuits may include closed-loop circuits, such as voltage regulators, LDO (low drop out) regulators, PMICs (Power Management Integrated Circuits), etc., as well as other circuits. In some example embodiments, the open-circuit detector is used to detect a pin-lift condition of a closed-loop circuit having a weak pull down.

Pin-lift is herein defined as anything that would interfere with continuity (e.g. broken wire, broken wire-bond, broken integrated circuit trace, solder break, un-plugging a device, etc.), either internal to an integrated circuit, internal to a chip package, on a printed circuit board (PCB), or within an electronic system.

Example embodiments of this open-circuit detector use a current source to inject a fixed current into the monitored circuit and a detection circuit to monitor one or more nodes in the circuit. In some example embodiments, the current is injected periodically by a controller (e.g. state machine) and continuous monitoring is done to check for any pin-lift conditions during operation, at power up, at power down, under load, and under no load.

The voltage developed on the output pin during the current injection is monitored by a detector circuit. If a pin-lift condition is present, the injected current will quickly pull up the pin causing the comparator to trip and flag an overvoltage at the pin. If conditions are normal, the injected current is absorbed by the load (on the pin) and no overvoltage condition is generated.

The open-circuit detector is designed to be added onto existing voltage regulators (e.g. LDOs) and does not require any changes to the functional or parametric requirements of the voltage regulators to work. No additional pin is required for this open-circuit detector.

FIG. 1A represents a first example 100 of an open-circuit detector. The example 100 shows internal circuits 102 (e.g. IC, chip, die, etc.) and external circuits 104 (e.g. PCB, load, etc.)

The internal circuits 102 include a closed-loop circuit 106 and the open-circuit detector which includes a first current source 108, a detector 110, and a controller 112 (e.g. digital state-machine). The external circuits 104 in this example include an external output capacitor (Cout) and a load current (Iload). For example embodiments where the closed-loop circuit 106 is a voltage regulator (e.g. LDO), the external output capacitor supports fast transient loads as well as provides DC stability for the voltage regulator.

The open-circuit detector works by the controller 112 closing switch S1 and thereby injecting a current Ipu periodically at an output pin 114 of the closed-loop circuit 106 (e.g. voltage regulator). Ipu is periodically injected by the controller 112 digitally controlling the switch S1.

The detector 110 monitors a voltage at the output pin 114, and compares the voltage to a predetermined threshold voltage, which if exceeded during the Ipu current injection, sets the OV flag 116.

In various example embodiments, the closed-loop circuit 106 can be any linear regulator (PMOS or NMOS) with the ability to source current from the supply Vin_ldo. The supply voltages Vin_op_amp and Vin_ldo may or may not be the same depending on the architecture of the closed-loop circuit 106 and this has no effect on the working of the open-circuit detector.

For example voltage regulator embodiments, Vin_cs is a voltage that is greater than the regulated output voltage of the voltage regulator. Vin_cs can be connected to a highest supply on this chip, or it can be connected to Vin_ldo. If Vin_ldo is shorted to Vin_cs the headroom requirement of current source Ipu becomes smaller. If Vin_cs is connected to a higher supply voltage, high voltage devices may be required which occupies more circuit area for the same current density.

S1 is a switch with low Rdson digitally controlled by the controller 112. A timing (Tperiod) of this control is dictated by the acceptable ripple allowed on Cout and the sampling time (Ton) of the failure detection. For example for an allowed a 5 mV ripple for a 3.3V/5V output with a pin-lift failure being detected within 5 ms can use a Ton of 80 us and Tperiod of 2 ms.

The open-circuit detector has at least two operating modes (e.g. a normal, no-fault mode and a pin-lift, fault mode.

In normal, no-fault operation of the voltage regulator, the injected current Ipu will either be absorbed by the load (Iload) or integrated over the external capacitor (Cout) depending on the value of the load. For light load conditions, the periodically injected current Ipu causes an output ripple on the output voltage of the external capacitor. This ripple is relatively small and within the acceptable accuracy of the voltage regulator.

However, during pin-lift, fault operation, the external capacitor (Cout) and load (Iload) are disconnected. The periodically injected current Ipu instantly pulls up the voltage regulator's output. This overvoltage is detected to produce an OV flag 116 to notify the controller 112 that a fault has occurred. While the FIG. 1 example shows the OV flag 116 being set by detecting a overvoltage at the output pin 114, in other example embodiments a different voltage internal to the closed-loop circuit 106 may instead be monitored.

Figure 1B:
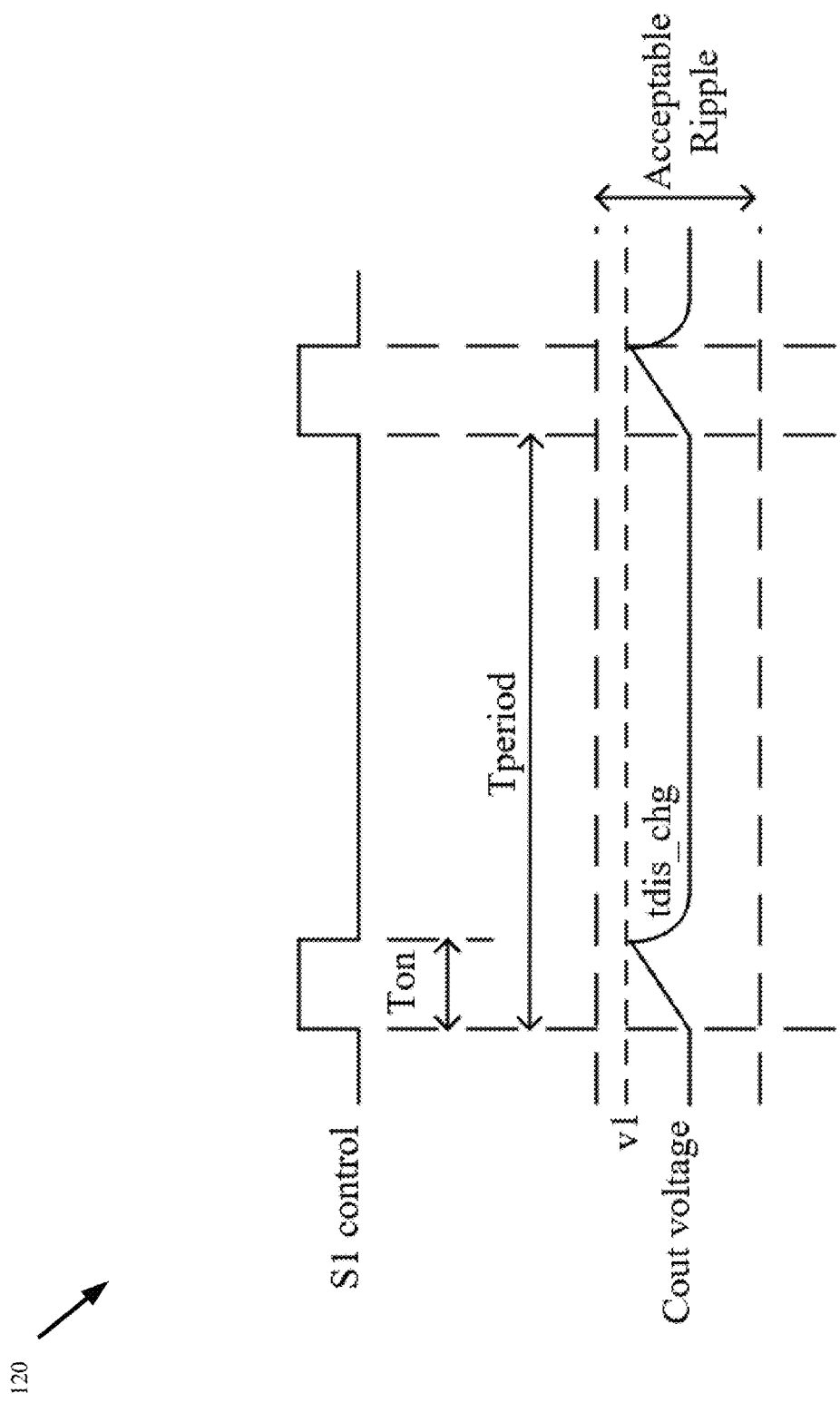
FIG. 1B represents an example no-fault timing diagram of the first example open-circuit detector.

FIG. 1B represents an example no-fault timing diagram 120 of the first example 100 open-circuit detector. Shown is the switch S1 state having a Tperiod and Ton time when current is injected at the output pin 114. The Cout voltage is monitored by the detector 110 and is the same as the voltage at the output pin 114. An "acceptable ripple" is also shown based on an application that will not violate the application's design rules.

V1 is the predetermined threshold voltage, which if exceeded during the Ton current injection, sets the OV flag 116. During normal mode, the value of V1 is given by Vout+((Ipu/Cout)*Ton). This calculation assumes an external load current (Iload) of 0A, which is a worst case scenario when the acceptable voltage ripple design specification is considered. If the external load current is sufficiently larger than Ipu, Ipu will be absorbed by the load and the ripple becomes even smaller than V1.

Tdis_chg is determined by Ileakage. Ileakage models internal resistor dividers and/or other current leakage paths that are connected to the output of closed-loop circuit 106. These resistors may provide the following functions including but not limited to output voltage detection, feedback for stability, sampling the output voltage for an ADC.

Figure 1C:
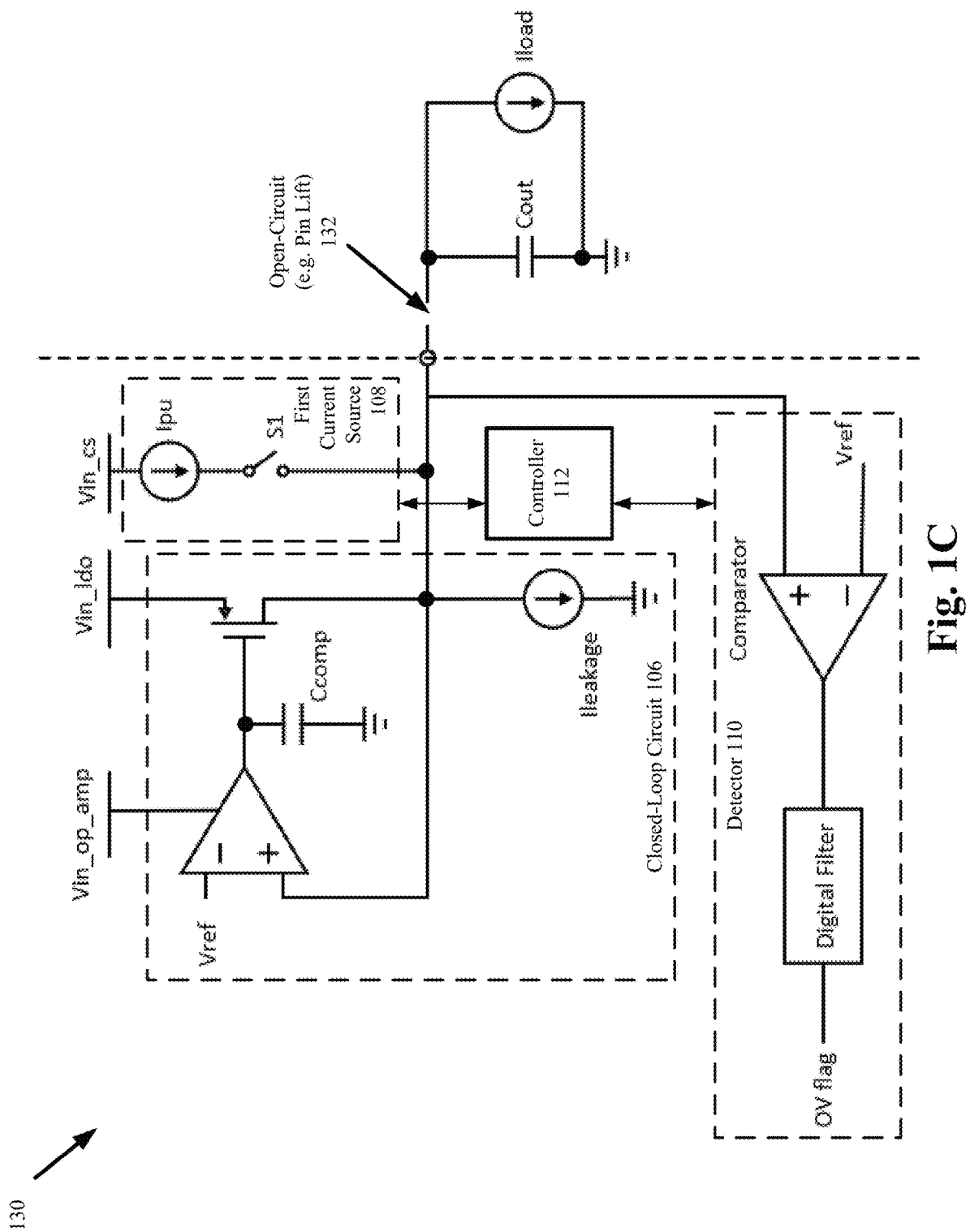
FIG. 1C represents an example fault state detectable by the first example open-circuit detector.

FIG. 1C represents an example fault state 130 detectable by the first example 100 open-circuit detector. The circuit in this example fault state 130 is the same as for example 100 except for an open-circuit (e.g. Pin Lift) event 132.

Figure 1D:
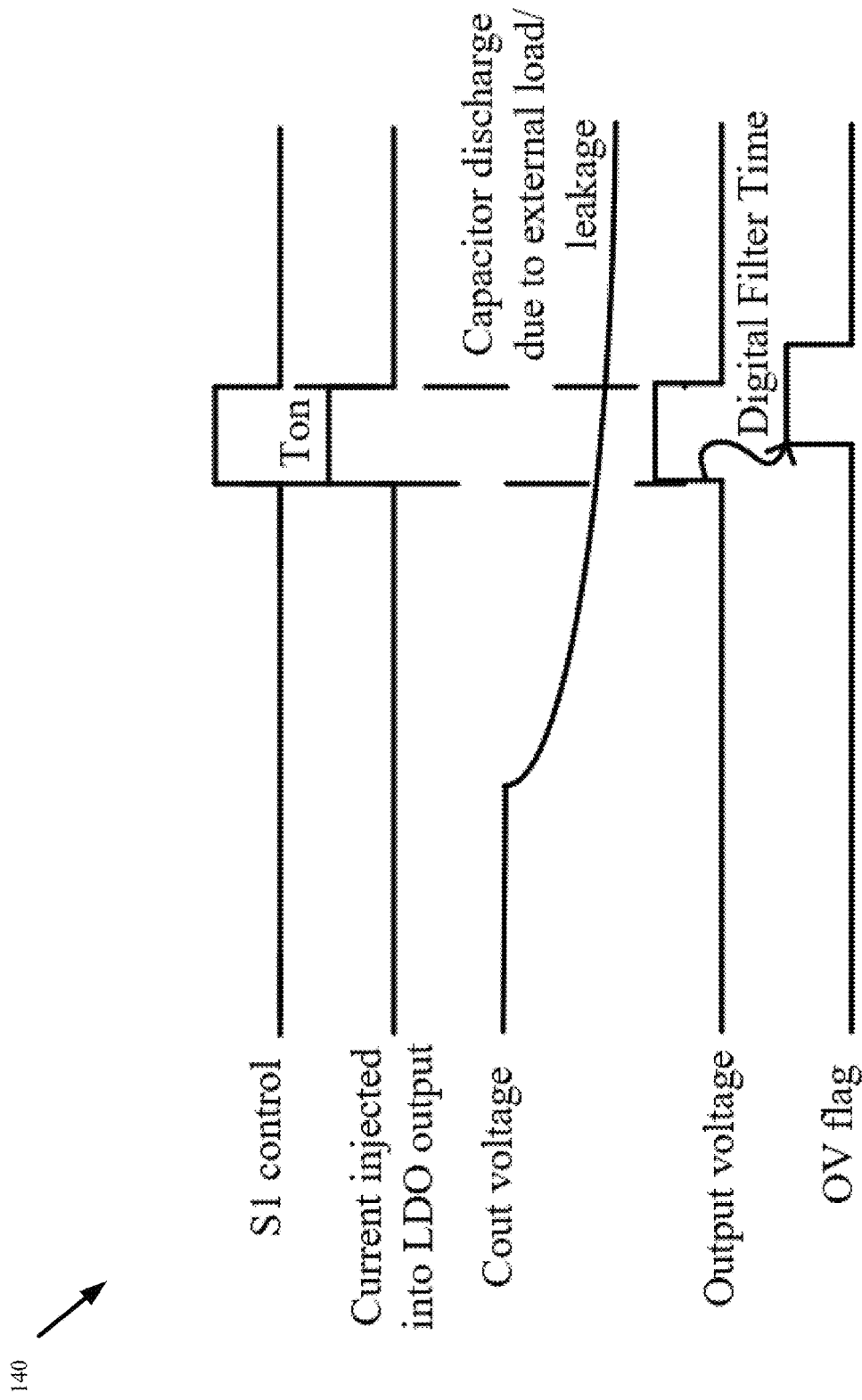
FIG. 1D represents a first example fault timing diagram of the first example open-circuit detector.

FIG. 1D represents a first example fault timing diagram 140 of the first open-circuit detector. When the pin-lift event 132 occurs (see FIG. 1C), capacitor Cout is disconnected from the closed-loop circuit 106 output. Thus, when switch S1 is closed by the controller 112 then the current Ipu pulls the output voltage of the closed-loop circuit 106 higher than the overvoltage detection threshold after the pin-lift event 132 occurs. This overvoltage condition is detected by the detector 110 which then sets the OV flag 116 (e.g. indicator) after a digital filter. In this example embodiment, Ipu is sufficiently large to overcome the leakage current Ileakage. Note that Cout voltage decays over time due to the external load or other leakage.

Figure 2:
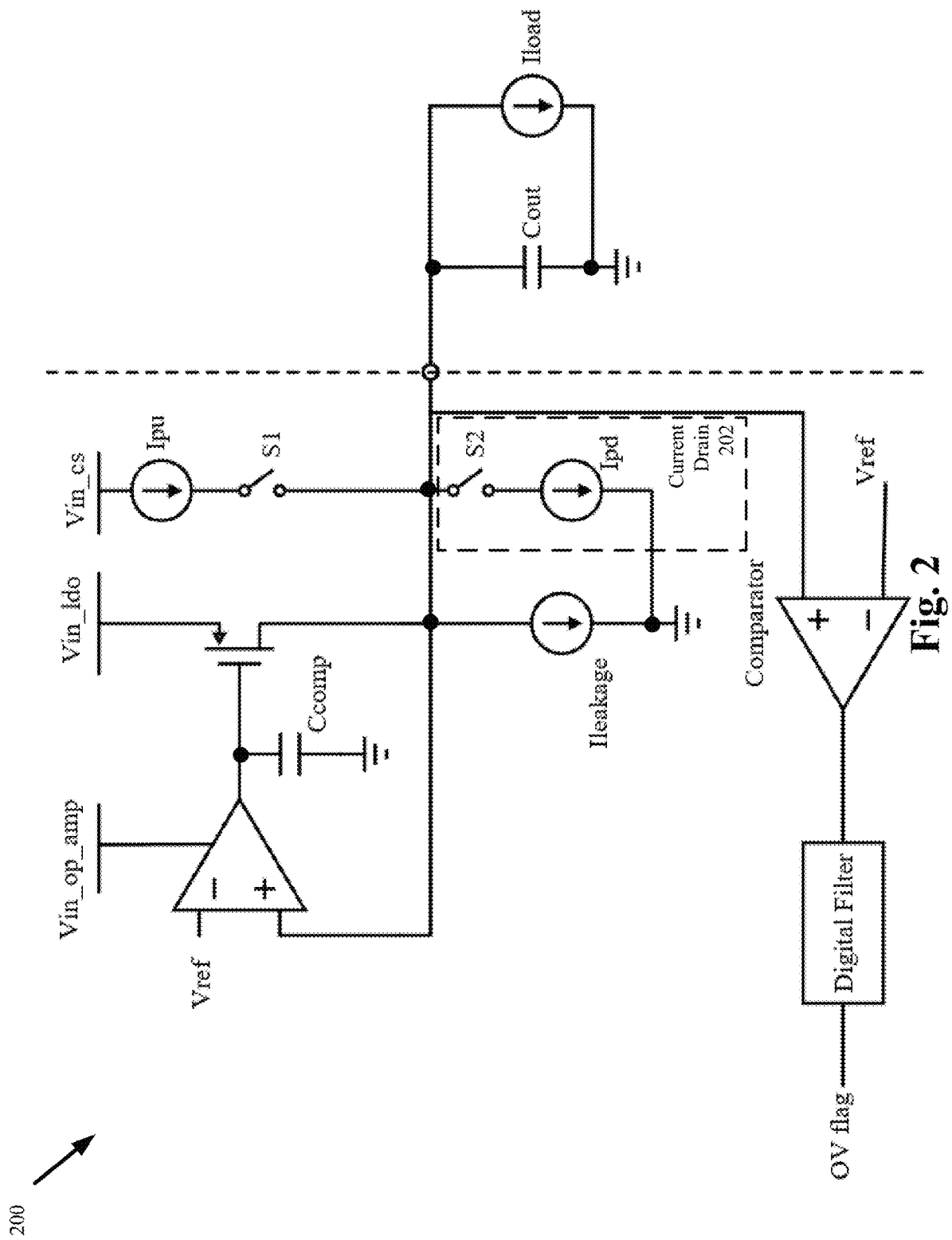
FIG. 2 represents a second example of the open-circuit detector.

FIG. 2 represents a second example 200 of the open-circuit detector. The second example 200 is substantially same as the first example 100 except for the addition of a current drain 202. The closed-loop circuit 106, first current source 108, detector 110, and controller 112 are still present in the second example 200 but are not labeled here to increase clarity.

The second example 200 of the open-circuit detector is applicable to example embodiments where the closed-loop circuit's 106 value of Tdis_chg (see FIG. 1B) is larger than Toff (i.e. time during Tperiod not including Ton). In such example embodiments capacitor Cout is not be sufficiently discharged before the next current pulse is injected. This is occurs if Ileakage is relatively small.

To assist with the discharge, the current drain 202, having a drain current Ipd and a switch S2, is added to provided to more quickly discharge Cout. The switch S2 is also controlled by the controller 112.

Figure 3A:
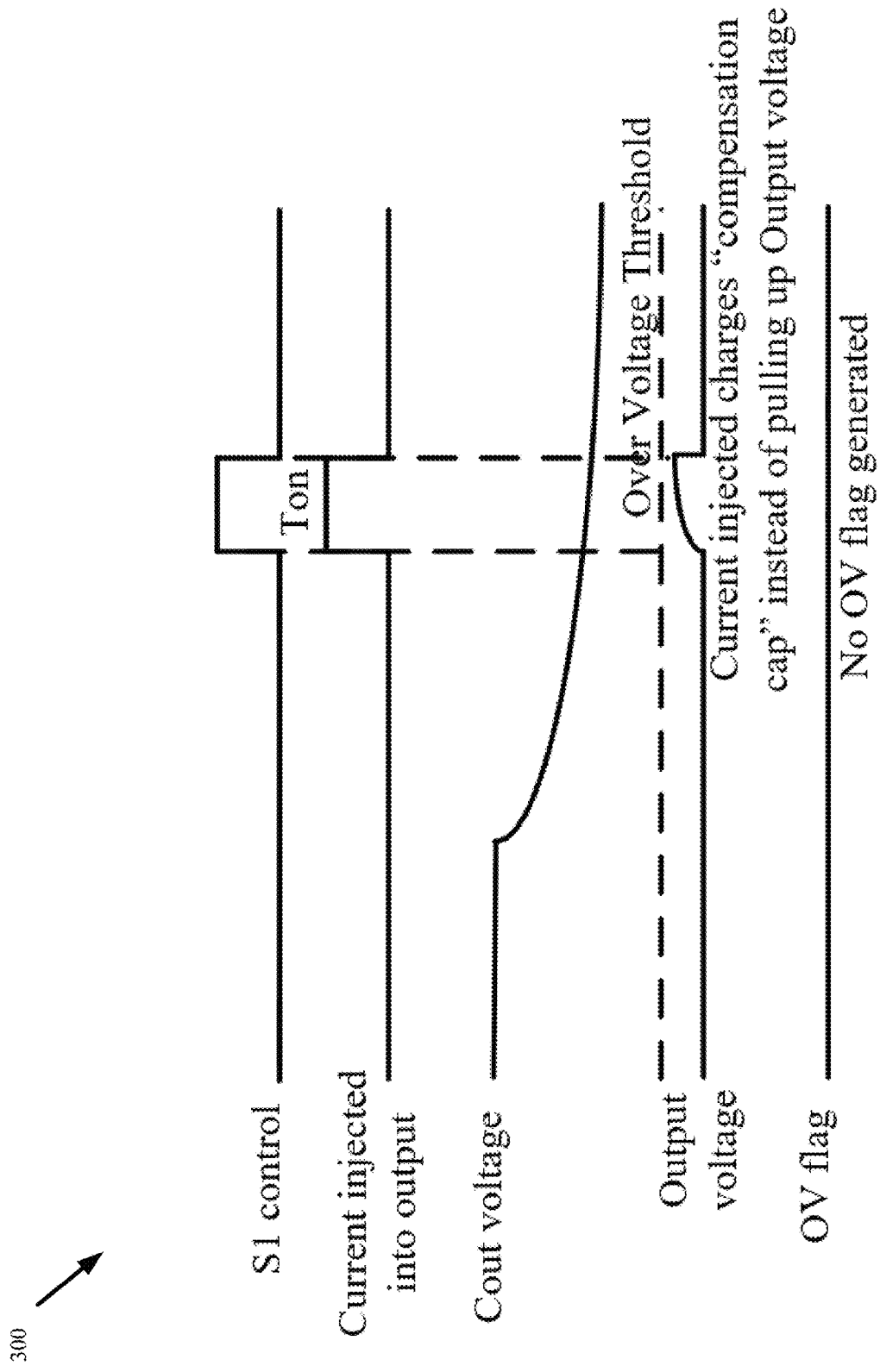
FIG. 3A represents a second example fault timing diagram of the first example open-circuit detector.

FIG. 3A represents a second example fault timing diagram 300 of the first example 100 open-circuit detector. Linear voltage regulators for loop stability are often compensated with an internal capacitor (Ccomp) connected to a gate of the regulators output driver (as shown in FIG. 1A). The value of the internal capacitor Ccomp is usually smaller than Cout by 5 to 6 orders of magnitude.

Figure 3B:
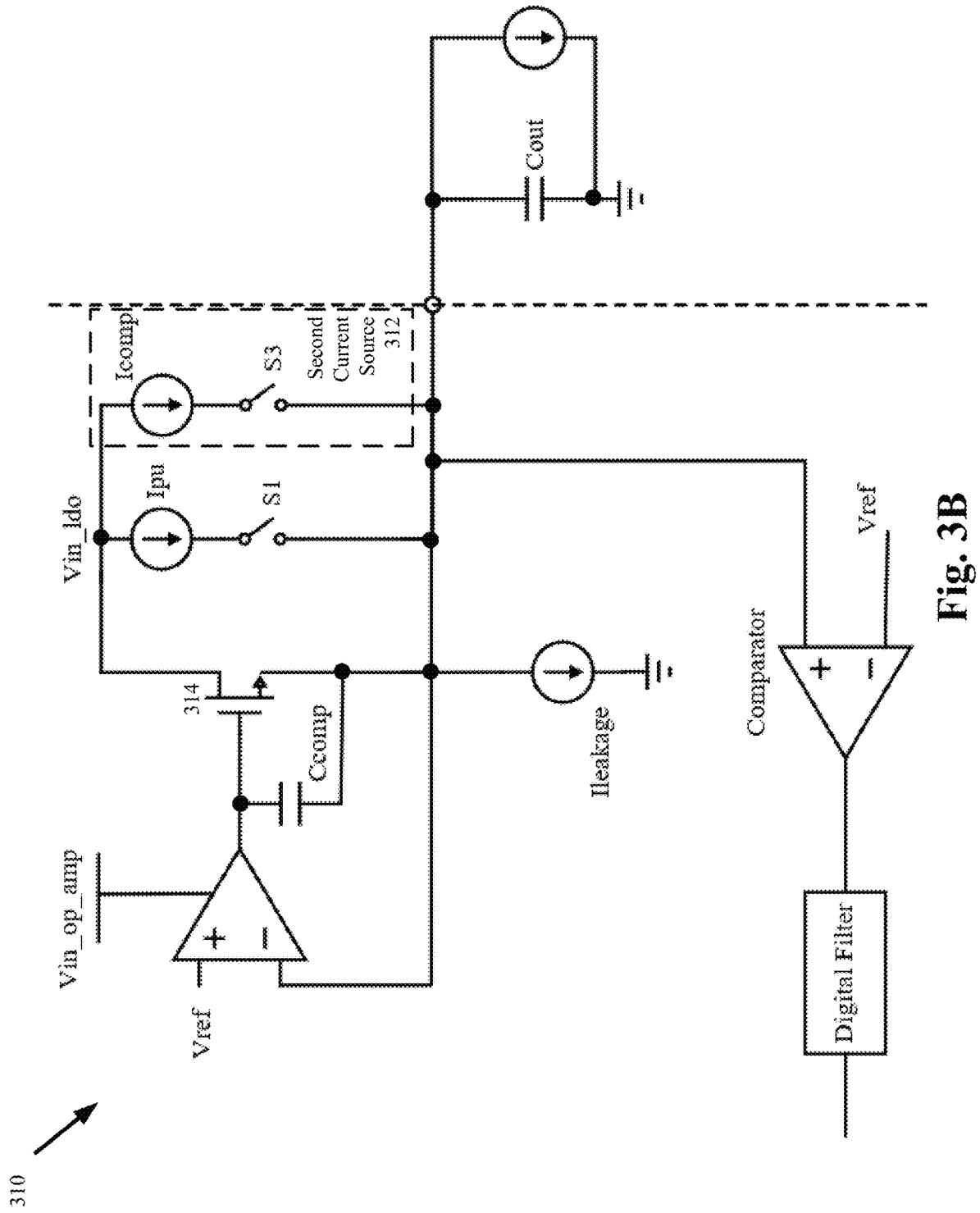
FIG. 3B represents a third example of the open-circuit detector.

However, during an open-circuit (e.g. Pin Lift) event 132, the compensation capacitor (Ccomp) in the closed-loop circuit 106 may need to be charged up by current source Ipu. If the current Ipu if is not large enough, the compensation capacitor (Ccomp) will take longer to charge and the closed-loop circuit 106 output voltage may not trigger an overvoltage flag within Ton as shown in FIG. 3A. If Ipu is simply increased to charge the internal compensation capacitor (Ccomp) faster during a fault mode, design constraints on the acceptable ripple (see FIG. 1B) during normal mode may be violated. FIG. 3B shows an example solution to this concern.

FIG. 3B represents a third example 310 of the open-circuit detector. The third example 310 is substantially same as the first example 100 except for the addition of a second current source 312 (Icomp) and identification of an output driver 314. The closed-loop circuit 106, first current source 108, detector 110, and controller 112 are still present in the third example 310 but are not labeled here to increase clarity. The second current source 312 (Icomp) is activated by a third switch S3 by the controller 112 to overcome this issue, and is switched in parallel with the first current source 108, having the current (Ipu) and the switch (S1), to charge the compensation capacitor (Ccomp) faster for at least a part of the Ton time.

Figure 3C:
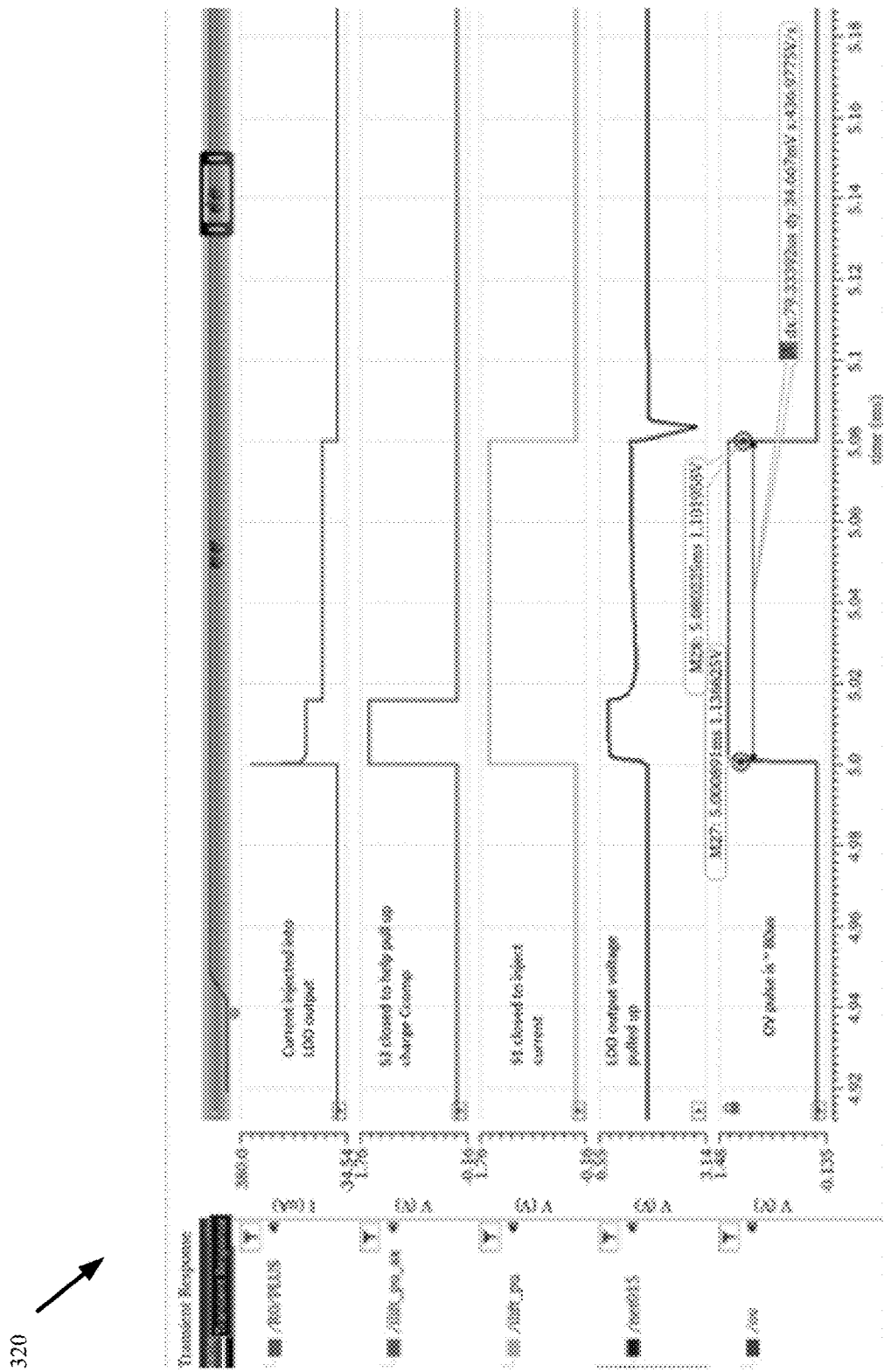
FIG. 3C represents a first example timing diagram of the third example open-circuit detector.

FIG. 3C represents a first example timing diagram 320 of the third example 310 open-circuit detector. The first example timing diagram 320 shows various waveforms for the third example 310 open-circuit detector, including showing an OV (over voltage) duration with auxiliary current injection by the second current source 312 (Icomp).

Figure 3D:
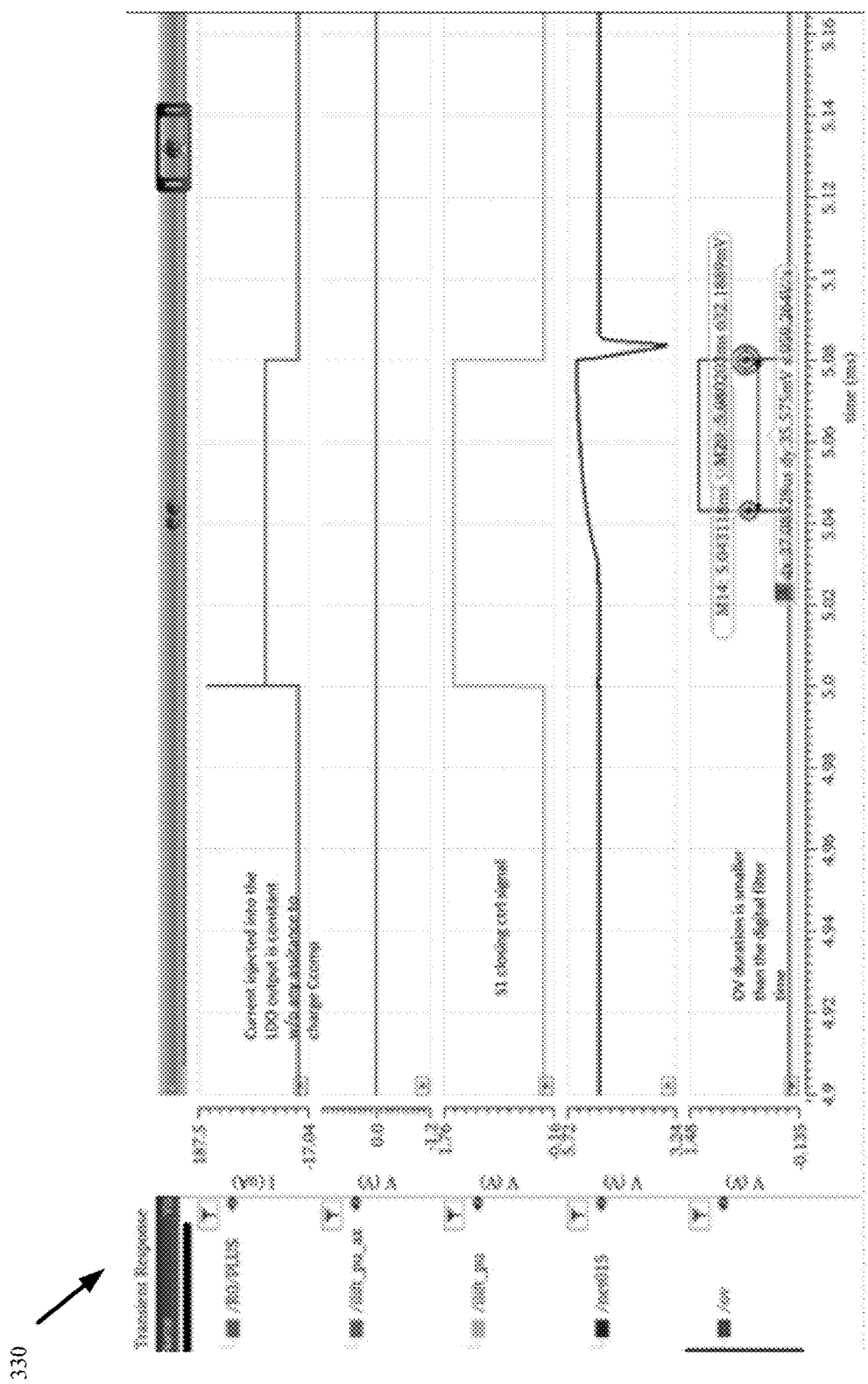
FIG. 3D represents a second example timing diagram of the third example open-circuit detector.

FIG. 3D represents a second example timing diagram 330 of the third example 310 open-circuit detector. The second example timing diagram 330 shows various waveforms for the third example 310 open-circuit detector, including showing an OV (over voltage) duration without auxiliary current injection by the second current source 312 (Icomp).

Figure 4:
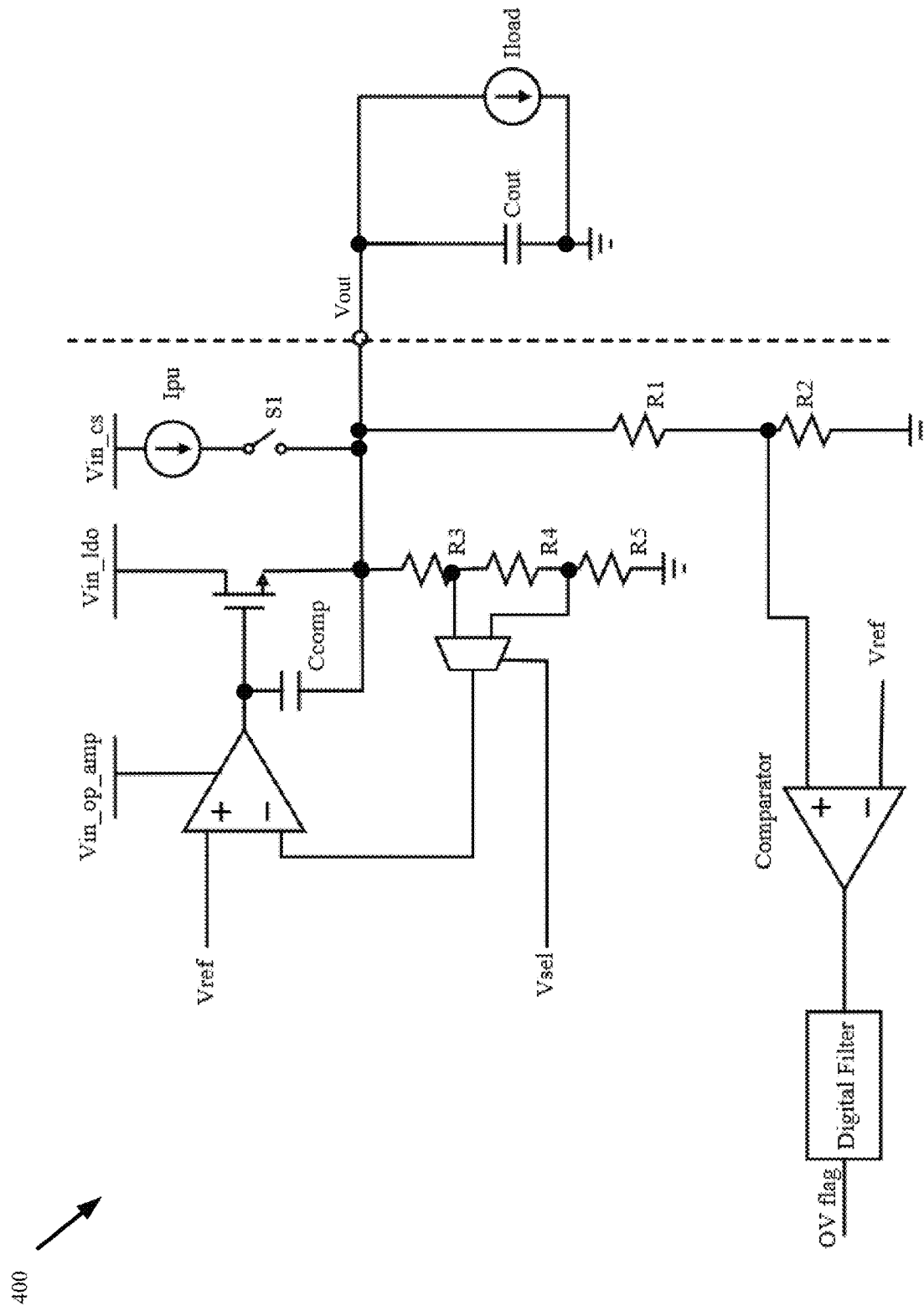
FIG. 4 represents a fourth example of the open-circuit detector.

FIG. 4 represents a fourth example 400 of the open-circuit detector. The fourth example 400 is an example implemented version of the first example 100 of the open-circuit detector. This example implemented version is configured to detect both an overvoltage and an undervoltage at Vout. Ileakage is modelled as resistors R1-2 and R3-5.

Figure 5:
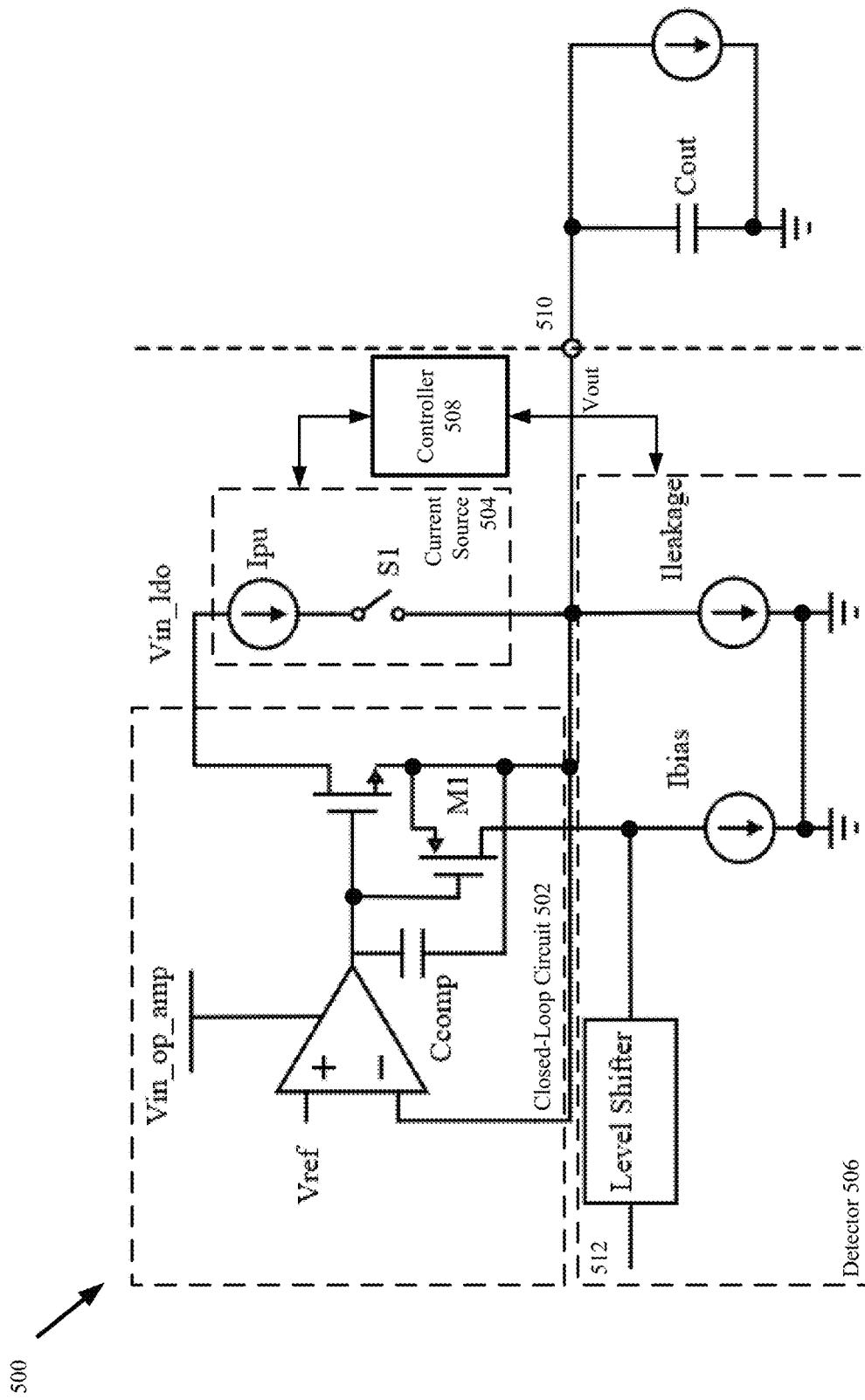
FIG. 5 represents a fifth example of the open-circuit detector.

FIG. 5 represents a fifth example 500 of the open-circuit detector. The fifth example 500 of the open-circuit detector includes a closed-loop circuit 502, and an open-circuit detector. The open-circuit detector includes a current source 504, a detector 506, and a controller 508. The detector 506 monitors a voltage at an output pin 510, and compares the voltage to a predetermined threshold voltage, which if exceeded during the Ipu current injection by the current source 504, sets an OV flag 512.

An op-amp present in the closed-loop circuit 502 (e.g. linear voltage regulator) can be used as a comparator to detect a pin-lift event. When a pin-lift occurs, a gate of the linear regulator begins to turn an output FET of the closed-loop circuit 502 off. The gate voltage is monitored to set the OV flag 512 (e.g. indicator).

Transistor M1 is a PMOS with its gate tied to the gate of the output FET of the closed-loop circuit 502. The sources of M1 and the output FET are also shorted together. M1 is biased using a current source Ibias. M1 and current source Ibias essential form an internal comparator.

During a pin-lift event, the gate is pulled down, turning M1 ON and pulling its drain up. A level shifter in the detector 506 is used to level shift this voltage to the digital supply before the flag is sent to the controller 508.

An advantage of the fifth example 500 of the open-circuit detector is a conventional two input comparator is not required. However, a speed of detection depends on the gm, bias currents and internal compensation capacitors within the closed-loop circuit 106.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transitory machine or computer-usable media or mediums as defined herein excludes signals, but such media or mediums may be capable of receiving and processing information from signals and/or other transitory mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. An open-circuit detector, comprising:
a first current source configured to inject a current at an output of a closed-loop circuit;
a detector configured to monitor a voltage of the closed-loop circuit;
wherein the detector is configured to indicate whether the voltage monitored exceeds a predetermined threshold voltage;
a controller configured to regulate the current injected by the first current source;
wherein the controller is configured to set an open-circuit flag if the current injected caused the voltage to exceed the predetermined threshold voltage; and
wherein the controller is configured to set the open-circuit flag if the voltage exceeded the predetermined threshold voltage within a predetermined time after the current was injected.

2. The detector of claim 1:
wherein the voltage monitored by the detector is at a regulated output of the closed-loop circuit.

3. The detector of claim 1:
wherein the voltage monitored by the detector is at a node internal to the closed-loop circuit.

4. The detector of claim 1:
wherein the controller is configured to cause the first current source to inject the current while the closed-loop circuit is operating.

5. The detector of claim 1:
wherein the controller is configured to cause the first current source to inject the current at multiple intervals after the closed-loop circuit starts operating and before the closed-loop circuit stops operating.

6. The detector of claim 1:
wherein the controller is configured to adjust an amplitude or duration of the current injected by the first current source based on a load current drawn at the output of the closed-loop circuit.

7. The detector of claim 1:
further comprising a current drain coupled between the output and a ground;
wherein the controller is configured to adjust an amount of a current drained by the current drain based on a discharge time of an external load capacitor coupled to the output.

8. The detector of claim 1:
wherein the output of the closed-loop circuit is configured to be coupled an external capacitor configured to keep the output voltage within a predetermined ripple voltage range; and
wherein the current injected by the current source does not cause the output voltage to exceed the predetermined ripple voltage range.

9. The detector of claim 1:
wherein the closed-loop circuit is a voltage regulator including an output driver and a compensation capacitor;
wherein the compensation capacitor is coupled to a gate of the output driver;
further comprising a second current source coupled in parallel with the first current source;
wherein the controller is configured to adjust a duration or amplitude of the current injected by the second current source based on a value of the compensation capacitor.

10. The detector of claim 1:
wherein the closed-loop circuit is a voltage regulator.

11. The detector of claim 10:
wherein the voltage regulator is a low drop out (LDO) regulator.

12. The detector of claim 10:
wherein the current is a pull up current injected at an output lead of the voltage regulator.

13. The detector of claim 1:
wherein the open-circuit detector is embedded within an integrated circuit.

14. The detector of claim 1:
wherein the detector is coupled to monitor the voltage at an output pin of a chip package.

15. The detector of claim 1:
wherein the detector is coupled to monitor the voltage at a wire bond between an integrated circuit die and a lead-frame within a chip package.

16. The detector of claim 1:
wherein the voltage monitored by the detector is at an output of an operational amplifier internal to the closed-loop circuit.

17. An open-circuit detector, comprising:
a first current source configured to inject a current at an output of a closed-loop circuit;
a detector configured to monitor a voltage of the closed-loop circuit;
wherein the detector is configured to indicate whether the voltage monitored exceeds a predetermined threshold voltage;
a controller configured to regulate the current injected by the first current source;
wherein the controller is configured to set an open-circuit flag if the current injected caused the voltage to exceed the predetermined threshold voltage;
further comprising a current drain coupled between the output and a ground;
wherein the controller is configured to adjust an amount of a current drained by the current drain based on a discharge time of an external load capacitor coupled to the output.

18. An open-circuit detector, comprising:
a first current source configured to inject a current at an output of a closed-loop circuit;
a detector configured to monitor a voltage of the closed-loop circuit;
wherein the detector is configured to indicate whether the voltage monitored exceeds a predetermined threshold voltage;
a controller configured to regulate the current injected by the first current source;
wherein the controller is configured to set an open-circuit flag if the current injected caused the voltage to exceed the predetermined threshold voltage;
wherein the output of the closed-loop circuit is configured to be coupled an external capacitor configured to keep the output voltage within a predetermined ripple voltage range; and
wherein the current injected by the current source does not cause the output voltage to exceed the predetermined ripple voltage range.

19. The An open-circuit detector of claim 18:
wherein the controller is configured to adjust an amplitude or duration of the current injected by the first current source based on a load current drawn at the output of the closed-loop circuit.

20. The An open-circuit detector of claim 18:
wherein the closed-loop circuit is a voltage regulator including an output driver and a compensation capacitor;
wherein the compensation capacitor is coupled to a gate of the output driver;
further comprising a second current source coupled in parallel with the first current source;
wherein the controller is configured to adjust a duration or amplitude of the current injected by the second current source based on a value of the compensation capacitor.

* * * * *